(12) United States Patent
Lv et al.

(10) Patent No.: US 12,223,870 B2
(45) Date of Patent: Feb. 11, 2025

(54) SCREEN MODULE, DISPLAY ASSEMBLY, AND ELECTRONIC DEVICE

(71) Applicant: Honor Device Co., Ltd., Shenzhen (CN)

(72) Inventors: Yan Lv, Shenzhen (CN); Bin Yan, Shenzhen (CN); Guotong Zhou, Shenzhen (CN); Dong Ma, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/790,347

(22) PCT Filed: Feb. 10, 2022

(86) PCT No.: PCT/CN2022/075894
§ 371 (c)(1),
(2) Date: Jun. 30, 2022

(87) PCT Pub. No.: WO2022/183893
PCT Pub. Date: Sep. 9, 2022

(65) Prior Publication Data
US 2024/0177641 A1 May 30, 2024

(30) Foreign Application Priority Data

Mar. 3, 2021 (CN) .......................... 202120461785.8
May 8, 2021 (CN) .......................... 202120970530.4

(51) Int. Cl.
*G09G 3/00* (2006.01)
*B32B 3/26* (2006.01)
(Continued)

(52) U.S. Cl.
CPC ............. *G09G 3/035* (2020.08); *B32B 3/263* (2013.01); *B32B 7/05* (2019.01); *G09F 9/301* (2013.01);
(Continued)

(58) Field of Classification Search
None
See application file for complete search history.

(56) References Cited

U.S. PATENT DOCUMENTS 10,229,963 B1  3/2019  Qi et al.
2016/0066412 A1*  3/2016  Choi ..................... G06F 1/1637
361/749
(Continued)

FOREIGN PATENT DOCUMENTS

CN  107247372 A  10/2017
CN  210535212 U  5/2020
(Continued)

*Primary Examiner* — Alexander S Thomas
(74) *Attorney, Agent, or Firm* — Conley Rose, P.C.

(57) ABSTRACT

A screen module uses a bendable display panel including a first panel layer and a second panel layer. A support layer is located between the first panel layer and the second panel layer. The first panel layer and the second panel layer are connected by a bent region, and a thickness of the support layer close to the bent region is greater than a thickness of a first region of the support layer. A projection of the first region of the support layer on the first panel layer overlaps with a projection of a display driver chip on the first panel layer. After being stacked, the thickness of the screen module may be reduced to meet the user's requirement for a small thickness of an electronic device.

20 Claims, 4 Drawing Sheets

(51) Int. Cl.
  *B32B 7/05* (2019.01)
  *G09F 9/30* (2006.01)
  *B32B 17/06* (2006.01)
  *G02F 1/1333* (2006.01)
  *H05K 1/14* (2006.01)

(52) U.S. Cl.
  CPC ........... *B32B 17/06* (2013.01); *B32B 2255/28* (2013.01); *B32B 2307/42* (2013.01); *B32B 2307/546* (2013.01); *G02F 1/133305* (2013.01); *H05K 1/147* (2013.01)

(56) References Cited

U.S. PATENT DOCUMENTS

| | | |
|---|---|---|
| 2018/0062094 A1 | 3/2018 | Kwon et al. |
| 2019/0036052 A1 | 1/2019 | Saeki et al. |
| 2020/0185641 A1 | 6/2020 | Jeong et al. |
| 2020/0342202 A1 | 10/2020 | Bae et al. |
| 2022/0110226 A1 | 4/2022 | Zhang et al. |

FOREIGN PATENT DOCUMENTS

| | | |
|---|---|---|
| CN | 111462634 A | 7/2020 |
| CN | 215581236 U | 1/2022 |
| WO | 2019089104 A1 | 5/2019 |

\* cited by examiner

SCREEN MODULE, DISPLAY ASSEMBLY, AND ELECTRONIC DEVICE

CROSS-REFERENCE TO RELATED APPLICATIONS

This application is a U.S. National Stage of International Application No. PCT/CN2022/075894 filed on Feb. 10, 2022, which claims priority to Chinese Patent Application No. 202120461785.8, filed with the China National Intellectual Property Administration on Mar. 3, 2021, and Chinese Patent Application No. 202120970530.4, filed with the China National Intellectual Property Administration on May 8, 2021, all of which are incorporated herein by reference in their entireties.

This application claims priority to Chinese Patent Application No. 202120461785.8, entitled "PANEL MODULE AND SCREEN", and filed with the China National Intellectual Property Administration on Mar. 3, 2021 and Chinese Patent Application No. 202120970530.4, entitled "SCREEN MODULE, DISPLAY ASSEMBLY, AND ELECTRONIC DEVICE", and filed with the China National Intellectual Property Administration on May 8, 2021, which are incorporated herein by reference in their entireties.

TECHNICAL FIELD

This application relates to the field of display technologies, and in particular, to a screen module, a display assembly, and an electronic device.

BACKGROUND

In an electronic device with a flexible screen, to shrink a lower black border of the electronic device with the flexible screen, a COP (chip on plastic) packaging technology is generally used. When the COP packaging technology is used, a display panel (panel) is bent to form a bent region. To ensure the reliability of the display panel, a specific bending radius needs to be ensured in the bent region formed by bending the display panel.

To control the bending radius of the display panel, the bent region of the display panel may be supported by a support layer. A display driver chip is further disposed in a lower region of the display panel, and the thickness of the display driver chip cannot be reduced, so the thickness of the electronic device with the flexible screen is generally large.

SUMMARY

Embodiments of this application provide a screen module, a display assembly, and an electronic device, to reduce a thickness of the screen module and a thickness of the display assembly.

According to a first aspect, this application provides a screen module. The screen module includes a display panel, a support layer and a display driver chip. The display panel is bent to form a first panel layer and a second panel layer spaced up and down; and the first panel layer and the second panel layer are connected by a bent region. The support layer is located between the first panel layer and the second panel layer. The display driver chip is located on a side of the second panel layer away from the first panel layer. A thickness of the support layer close to the bent region is greater than a thickness of a first region of the support layer; and a projection of the first region of the support layer on the first panel layer overlaps with a projection of the display driver chip on the first panel layer.

Based on the screen module, the screen module uses a bendable display panel, and a bent display panel, that is, the first panel layer and the second panel layer, is supported by the support layer to ensure a bending radius of the bent region. To reduce a thickness of the screen module, a support layer with a non-uniform thickness is used. That is, a thickness of the support layer close to the bent region is larger, which may ensure the bending radius of the bent region. A thickness of the support layer close to the display driver chip is smaller. After being stacked, the thickness of the screen module may be reduced to meet the user's requirement for a small thickness of an electronic device.

With reference to the first aspect, in a possible design manner, the support layer may include a first support plate and a second support plate, where the first support plate and the second support plate are stacked, and the second support plate is located on a side close to the bent region; and a length of the second support plate is less than a distance between the display driver chip and the bent region. In this way, after the first support plate and the second support plate are stacked, the thickness of the support layer close to the bent region is a sum of a thickness of the first support plate and a thickness of the second support plate to ensure the bending radius of the bent region; and the thickness of the support layer close to the display driver chip is only the thickness of the first support plate to reduce thicknesses of hierarchical structures after being stacked in the screen module, thereby reducing the thickness of the screen module.

With reference to the first aspect, in a possible design manner, the second support plate may be located on a side of the first support plate away from the first panel layer. In this way, the thickness of the screen module may be reduced, and the structural stability of the screen module may be further improved.

With reference to the first aspect, in a possible design manner, the support layer may include a first support plate and a second support plate, where the first support plate and the second support plate are disposed side by side; a thickness of the second support plate is greater than a thickness of the first support plate, and the second support plate is disposed close to the bent region; and a length of the second support plate is less than a distance between the display driver chip and the bent region. In this way, after the first support plate and the second support plate are disposed side by side, because the thickness of the first support plate is greater than the thickness of the second support plate, the thickness of the support layer close to the bent region is the thickness of the second support plate to ensure the bending radius of the bent region; and the thickness of the support layer close to the display driver chip is the thickness of the first support plate to reduce thicknesses of hierarchical structures after being stacked in the screen module, thereby reducing the thickness of the screen module.

With reference to the first aspect, in a possible design manner, the support layer may include a first support plate, and the first support plate is a support plate with a non-uniform thickness.

With reference to the first aspect, in a possible design manner, a bending radius of the bent region is less than 0.3 millimeters. Specifically, a bending radius of the bent region may be 0.2 millimeters to 0.3 millimeters.

According to a second aspect, this application provides a display assembly. The display assembly includes a glass cover plate and any possible screen module according to the first aspect, where the glass cover plate covers the screen module and is located on a side of the first panel layer away from the display driver chip.

With reference to the second aspect, in a possible design manner, the screen module further includes a polarizer layer; and the polarizer layer is located on a side of the first panel layer away from the display driver chip.

With reference to the second aspect, in a possible design manner, the polarizer layer of the screen module is adhesively connected to the glass cover plate through an optical clear adhesive layer.

According to a third aspect, this application provides an electronic device. The electronic device includes a battery cover and any possible display assembly according to the second aspect. The battery cover is located on a side of the screen module away from the glass cover plate.

It may be understood that for the beneficial effects that may be achieved by the display assembly according to the second aspect and the electronic device according to the third aspect, reference may be made to the beneficial effects in the first aspect and any possible design manner thereof, and details are not repeated herein.

Reference numerals: 10—mobile phone; 11—display assembly; 12—subscriber identity module card; 13—mobile phone board; 14—battery cover; 100—screen module; 200—glass cover plate; 101—display panel; 1011—first panel layer; 1012—second panel layer; 1013—bent region; 102—support layer; 1021—first support plate; 1022—second support plate; 103—display driver chip; 104—polarizer layer; and 105—optical clear adhesive layer.

DESCRIPTION OF EMBODIMENTS

To make the objectives, technical solutions, and advantages of this application clearer, the following further describes this application in detail with reference to the accompanying drawings.

The terms "first" and "second" mentioned below are merely intended for a purpose of description, and shall not be understood as an indication or implication of relative importance or implicit indication of the quantity of indicated technical features. Therefore, a feature defined by "first" or "second" can explicitly or implicitly includes one or more features. In the description of this application, unless otherwise stated, "a plurality of" means two or more than two.

In addition, in this application, position terms such as "upper", and "lower" are defined relative to an illustrative position of a component in the accompanying drawings. It should be understood that these direction terms are relative concepts and are used for relative description and clarification, and may vary accordingly depending on a position change in which components are placed in the accompanying drawings.

Currently, to increase a screen-to-body ratio of an electronic device, a flexible screen is used as a display panel of the electronic device. In the electronic device using the flexible screen, to shrink a black border at a lower bezel of the electronic device, the COP packaging technology is usually used. With the COP packaging technology, part of the display panel of the electronic device is bent, thereby shrinking the bezel.

Figure 1:
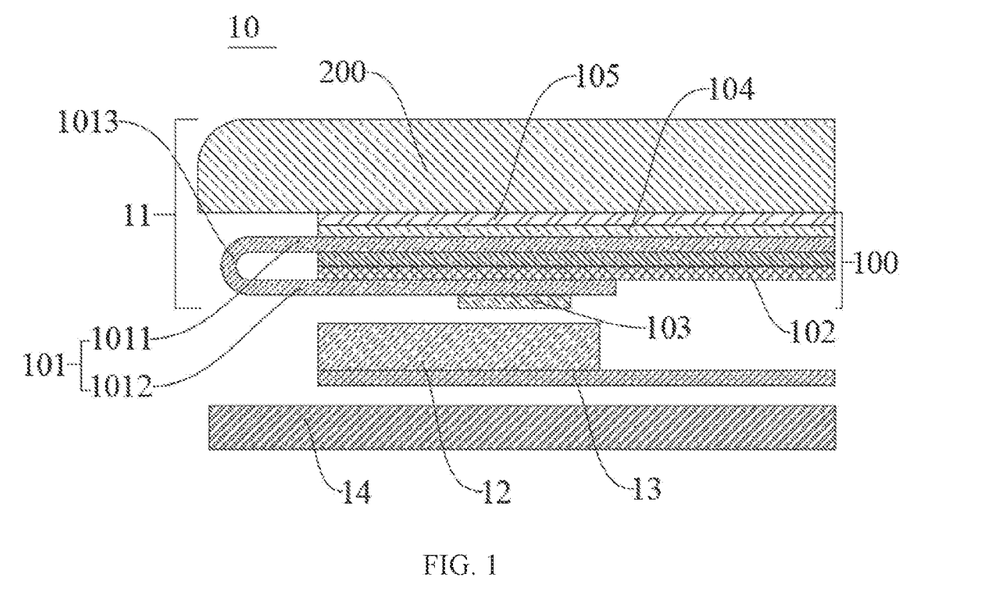
FIG. 1 is a schematic structural diagram of a mobile phone.

The following describes a structure of the electronic device by using a mobile phone as an example. Exemplarily, FIG. 1 is a schematic structural diagram of a mobile phone. As shown in FIG. 1, the mobile phone 10 includes a display assembly 11, a subscriber identity module (subscriber identity module. SIM) card 12, a mobile phone board 13, and a battery cover 14. The battery cover 14, the mobile phone board, the SIM card, and the display assembly are stacked sequentially. The display assembly includes a glass cover plate 200 and a screen module 100, and the glass cover plate 200 covers the screen module 100.

It should be understood that a structure of the mobile phone 10 is not limited to structures such as the display assembly 11, and may further include other structures, such as a middle bezel, a PCB board, and a camera module, which are not specially limited in the embodiments of this application.

For the screen module 100, the screen module 100 includes a display panel (panel) 101 that may be bent. To ensure the reliability of the display panel 101, when the COP packaging technology is used for packaging, it is necessary to ensure that a bent portion of the display panel 101 has a specific bending radius. To control the bending radius of the display panel 101, the bent region 1013 of the display panel 101 may be supported by the support layer 102, and the bending radius of the bent display panel 101 may be controlled by the thickness of the support layer 102. In addition, in the screen module 100, a lower region of the display panel 101 is further provided with a display driver chip 103, and a thickness of the display driver chip 103 cannot be reduced, so a thickness of the electronic device with the flexible screen (such as the mobile phone shown in FIG. 1) is generally large.

The thickness of the screen module 100 may be reduced to reduce the thickness of the electronic device. To reduce the thickness of the screen module 100, an embodiment of this application provides an improved screen module. The screen module provided in this embodiment of this application is described in detail below with reference to FIG. 2 to FIG. 4.

Figure 2:
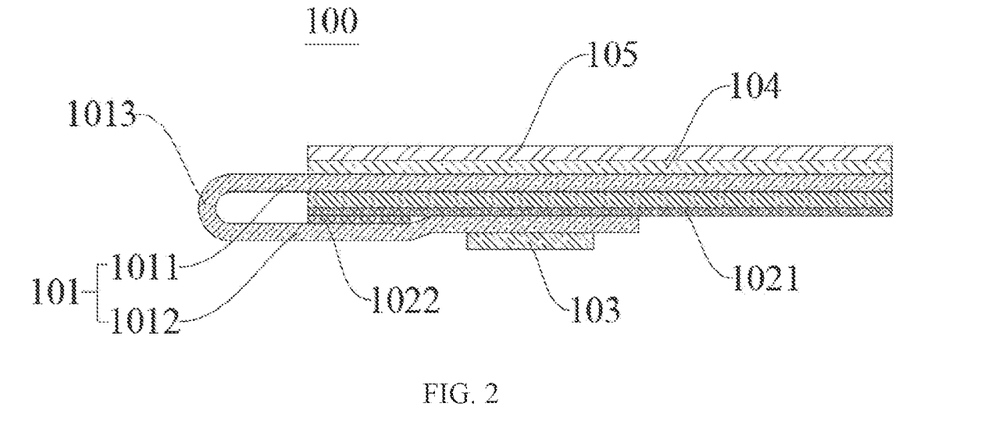
FIG. 2 is a schematic structural diagram 1 of a screen module according to an embodiment of this application.
Figure 3:
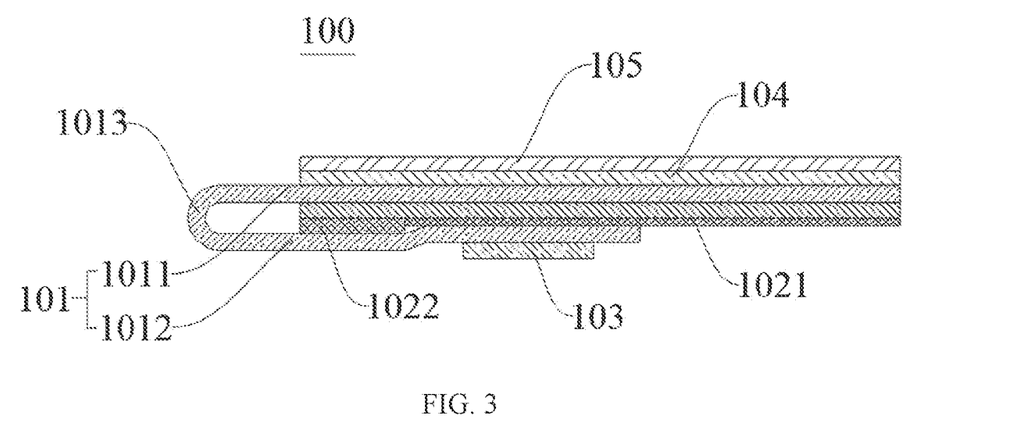
FIG. 3 is a schematic structural diagram 2 of a screen module according to an embodiment of this application.
Figure 4:
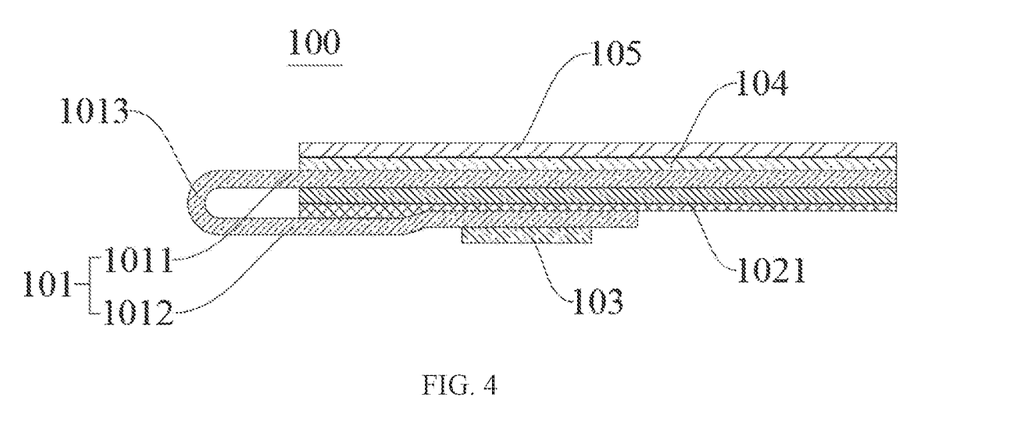
FIG. 4 is a schematic structural diagram 3 of a screen module according to an embodiment of this application.

As shown in FIG. 2, FIG. 3, and FIG. 4, the screen module 100 includes a display panel 101, a support layer 102, and a display driver chip 103. The display panel 101 is a flexible and bendable panel, and the display panel 101 is bent to form a first panel layer 1011 and a second panel layer 1012 spaced up and down. The first panel layer 1011 and the second panel layer 1012 are connected by a bent region 1013.

The bent region 1013 is formed by bending the display panel 101. The support layer 102 is configured to form support between the first panel layer 1011 and the second panel layer 1012 to ensure the bending radius of the bent region 1013. Generally, the bending radius of the bent region 1013 may be less than 0.3 millimeters, and may be specifically 0.2 millimeters to 0.3 millimeters. Therefore, the support layer 102 is located between the first panel layer 1011 and the second panel layer 1012. The display driver chip 103 is configured to drive the display panel 101 to display characters, patterns, colors, or the like. When the COP packaging technology is used, the display driver chip 103 is located below the display panel 101. That is, the display driver chip 103 is located on a side of the second panel layer 1012 away from the first panel layer 1011.

For the support layer 102, the thickness of the support layer 102 close to the bent region 1013 is greater than the thickness of the first region in the support layer 102. A projection of the first region of the support layer 102 on the first panel layer 1011 overlaps with a projection of the display driver chip 103 on the first panel layer 1011. That is, a thickness of the support layer 102 close to the bent region 1013 is larger, which may ensure the bending radius of the bent region 1013. A thickness of the support layer 102 close to the display driver chip 103 is smaller. After being stacked, the thickness of the screen module 100 may be reduced to meet the user's requirement for a small thickness of an electronic device.

It should be noted that a material of the support layer 102 may be a metal material or a non-metal material, such as polyethylene glycol terephthalate (polyethylene glycol terephthalate, PET), foam, silica gel, aluminum alloy, copper alloy, stainless steel, iron, or the like, or a combination of a plurality of different materials. Therefore, the material of the support layer 102 is not specially limited in this embodiment of this application.

It should be understood that other hierarchical structures such as a substrate and super clean foam (super clean foam, SCF) may be further disposed between the first panel layer 1011 and the support layer 102, which are not specially limited in the embodiments of this application.

To achieve a larger thickness of the support layer 102 close to the bent region 1013 and a smaller thickness of the support layer 102 close to the display driver chip 103, this application provides a plurality of implementations shown in FIG. 2 to FIG. 4.

In some embodiments, a solution of two support plates of different sizes may be used. That is, as shown in FIG. 2, the support layer 102 shown in FIG. 1 may include a first support plate 1021 and a second support plate 1022, where a size of the first support plate 1021 is larger and a size of the second support plate 1022 is smaller. After the first support plate 1021 and the second support plate 1022 are stacked, the second support plate 1022 is located on a side close to the bent region 1013, so that the thickness of the support layer 102 close to the bent region 1013 is larger. In addition, the size of the second support plate 1022 is less than a distance between the display driver chip 103 and the bent region 1013, so that the second support plate 1022 is not within an overlapping range of the display driver chip 103 and the display panel 101, avoiding increasing the thickness of the screen module 100 after the support layer 102 and the display driver chip 103 are stacked. In this way, after the first support plate 1021 and the second support plate 1022 are stacked, the thickness of the support layer 102 close to the bent region 1013 is a sum of a thickness of the first support plate 1021 and a thickness of the second support plate 1022 to ensure the bending radius of the bent region 1013; and the thickness of the support layer 102 close to the display driver chip 103 is only the thickness of the first support plate 1021 to reduce thicknesses of hierarchical structures after being stacked in the screen module 100, thereby reducing the thickness of the screen module 100.

Further, because the material of the support layer 102 may be a hard material such as stainless steel or iron, the first support plate 1021 may not be bendable. If the second support plate 1022 is located on a side of the first support plate 1021 close to the first panel layer 1011, that is, the second support plate 1022 is located between the first support plate 1021 and the first panel layer 1011, then because the first support plate 1021 cannot be bent, the thickness of the screen module 100 cannot be significantly reduced after the first support plate 1021 and the second support plate 1022 are stacked. In addition, if the first support plate 1021 cannot be bent and the size of the first support plate 1021 is greater than that of the second support plate 1022, then there is a gap between the first support plate 1021 and the first panel layer 1011, which is not conducive to the structural stability of the screen module 100. Therefore, as shown in FIG. 2, the second support plate 1022 is located on a side of the first support plate 1021 away from the first panel layer 1011. In this way, the thickness of the screen module 100 may be reduced, and the structural stability of the screen module 100 may be further improved.

In some embodiments, as shown in FIG. 3, a solution of two support plates with different sizes is still used. That is, the support layer 102 shown in FIG. 1 may include a first support plate 1021 and a second support plate 1022. Different from the solution shown in FIG. 2, the first support plate 1021 and the second support plate 1022 are disposed side by side. As shown in FIG. 3, to achieve a thicker support layer 102 close to the bent region 1013 and a thinner support layer 102 close to the display driver chip 103, the thickness of the second support plate 1022 close to the bent region 1013 is greater than the thickness of the first support plate 1021, and a length of the second support plate 1022 is less than a distance between the display driver chip 103 and the bent region 1013. In this way, after the first support plate 1021 and the second support plate 1022 are disposed side by side, because the thickness of the first support plate 1021 is greater than the thickness of the second support plate 1022, the thickness of the support layer 102 close to the bent region 1013 is the thickness of the second support plate 1022 to ensure the bending radius of the bent region 1013; and the thickness of the support layer 102 close to the display driver chip 103 is the thickness of the first support plate 1021 to reduce thicknesses of hierarchical structures after being stacked in the screen module 100, thereby reducing the thickness of the screen module 100.

In some embodiments, as shown in FIG. 4, a support plate with a non-uniform thickness is used as the support layer 102 shown in FIG. 1, that is, the support layer 102 includes the first support plate 1021. The first support plate 1021 is a support plate with a non-uniform thickness, and the first support plate 1021 has a thickness on a side close to the bent region 1013 greater than a thickness on a side away from the bent region 1013.

It may be understood that in a screen module using a COG process to implement a screen packaging process, a flexible printed circuit (flexible printed circuit. FPC) connected to the display panel (panel) is also bent to form a bent region. To ensure the bending radius of the bent region, a solution of the support layer in FIG. 2, FIG. 3, or FIG. 4 may also be used to reduce the thickness of the screen module. Similarly, in a screen module using a COF process to implement a screen packaging process, a COF chip on film connected to the display panel (panel) is also bent to form a bent region. To ensure the bending radius of the bent region in the COF chip on film, a solution of the support layer in FIG. 2, FIG. 3, or FIG. 4 may also be used to reduce the thickness of the screen module.

Figure 5:
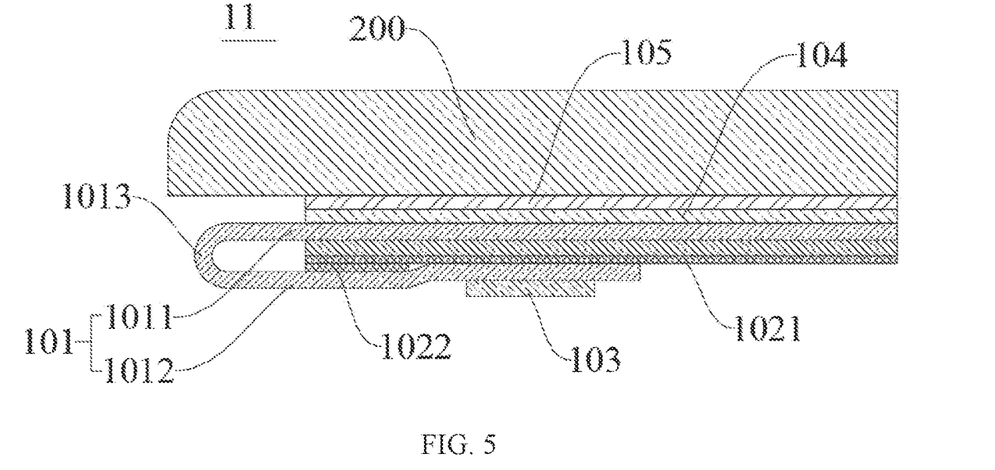
FIG. 5 is a schematic structural diagram 1 of a display assembly according to an embodiment of this application.
Figure 6:
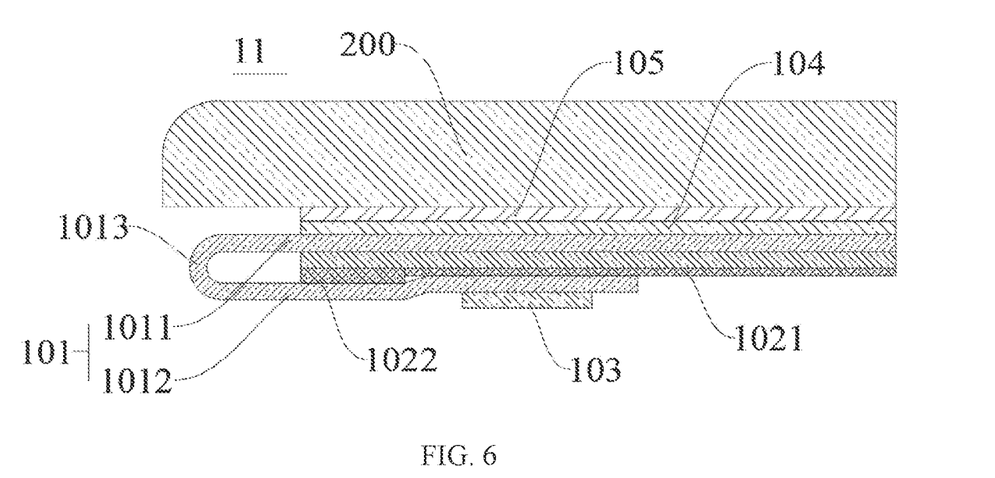
FIG. 6 is a schematic structural diagram 2 of a display assembly according to an embodiment of this application.
Figure 7:
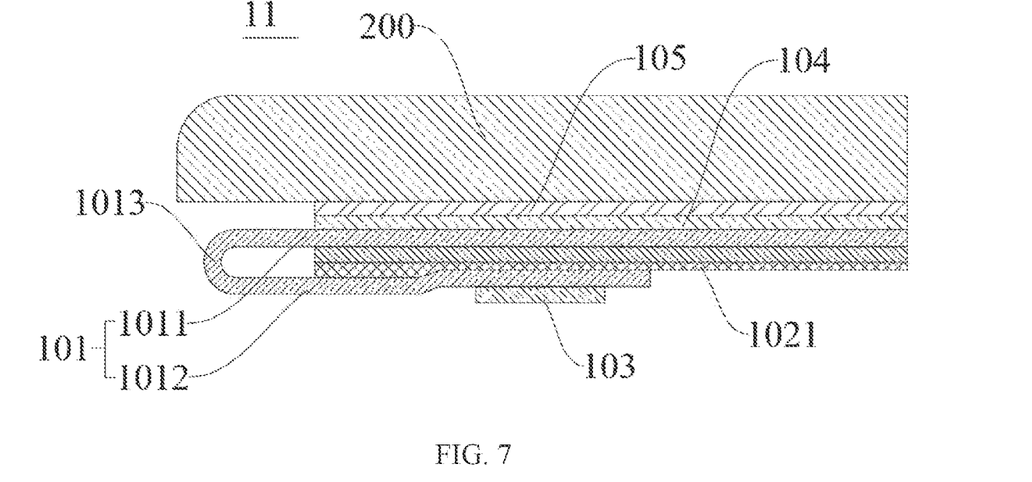
FIG. 7 is a schematic structural diagram 3 of a display assembly according to an embodiment of this application.

According to another aspect, an embodiment of this application provides a display assembly. As shown in FIG. 5, FIG. 6, or FIG. 7, the display assembly includes a glass cover plate 200 and the screen module 100 shown in FIG. 2, FIG. 3, or FIG. 4. The glass cover plate 200 covers the screen module 100 and is located on a side of the first panel layer 1011 away from the display driver chip 103.

In addition, the screen module 100 further includes a polarizer layer 104. The polarizer layer 104 is located on a side of the first panel layer 1011 away from the display driver chip 103. In addition, the polarizer layer 104 of the screen module 100 is adhesively connected to the glass cover plate 200 through an optical clear adhesive layer 105.

Figure 8:
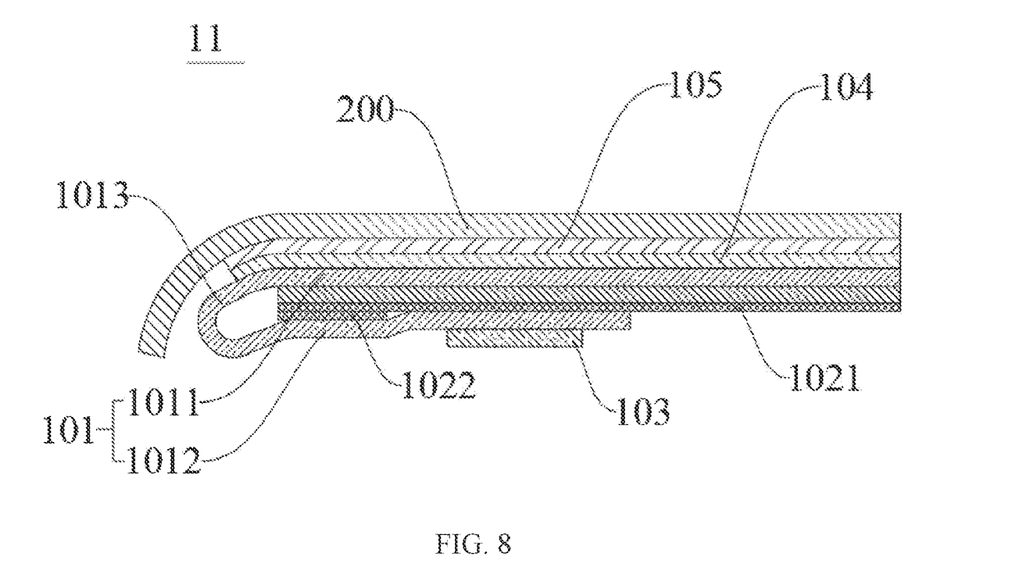
FIG. 8 is a schematic structural diagram 4 of a display assembly according to an embodiment of this application.

It should be noted that the glass cover plate 200 may be a plane or a curved surface. As shown in FIG. 8, when the glass cover plate 200 is a curved surface, the bent region 1013 of the display panel 101 and the first panel layer 1011 are not on the same plane. In this case, the support layer 102 in the screen module 100 may still use the solution shown in FIG. 2, FIG. 3, or FIG. 4 to reduce the thickness of the entire screen module, and the specific solution is not repeated herein.

It should be understood that for the technical effects of the display assembly provided in this embodiment of this application, reference may be made to the technical effects of the screen module 100 shown in FIG. 2, FIG. 3, or FIG. 4, and details are not repeated herein.

According to still another aspect, this application provides an electronic device. The electronic device includes a battery cover 14 and the display assembly shown in FIG. 5, FIG. 6, or FIG. 7. The battery cover 14 is located on a side of the screen module 100 away from the glass cover plate 200.

It should be understood that for the technical effects of the display assembly provided in this embodiment of this application, reference may be made to the technical effects of the screen module 100 shown in FIG. 2, FIG. 3, or FIG. 4, and details are not repeated herein.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A screen module, comprising:
    a single display panel bent to form a first panel layer and a second panel layer, wherein the first panel layer is spaced apart from the second panel layer, and wherein the first panel layer and the second panel layer are connected by a bent region;
    a support layer located between the first panel layer and the second panel layer, wherein a thickness of the support layer close to the bent region is greater than a thickness of a first region of the support layer; and
    a display driver chip located on a side of the second panel layer away from the first panel layer,
    wherein a projection of the first region of the support layer on the first panel layer overlaps with a projection of the display driver chip on the first panel layer.

2. The screen module according to claim 1, wherein the support layer comprises a first support plate and a second support plate, wherein the first support plate and the second support plate are stacked, and wherein the second support plate is located on a side close to the bent region.

3. The screen module according to claim 2, wherein the second support plate is located on a side of the first support plate away from the first panel layer.

4. The screen module according to claim 2, wherein a bending radius of the bent region is less than 0.3 mm.

5. The screen module according to claim 1, wherein the support layer comprises a first support plate and a second support plate, wherein the first support plate and the second support plate are disposed side by side, wherein a thickness of the second support plate is greater than a thickness of the first support plate, wherein the second support plate is disposed close to the bent region, and wherein a length of the second support plate is less than a distance between the display driver chip and the bent region.

6. The screen module according to claim 1, wherein the support layer comprises a first support plate, and wherein the first support plate is a support plate with a non-uniform thickness.

7. The screen module according to claim 1, wherein a bending radius of the bent region is less than 0.3 mm.

8. The screen module according to claim 1, wherein a bending radius of the bent region is 0.2 mm to 0.3 mm.

9. A display assembly, comprising:
    a glass cover plate; and
    a screen module, comprising:
        a single display panel bent to form a first panel layer and a second panel layer, wherein the first panel layer is spaced apart from the second panel layer, and wherein the first panel layer and the second panel layer are connected by a bent region;
        a support layer located between the first panel layer and the second panel layer, wherein a thickness of the support layer close to the bent region is greater than a thickness of a first region of the support layer; and
        a display driver chip located on a side of the second panel layer away from the first panel layer, wherein a projection of the first region of the support layer on the first panel layer overlaps with a projection of the display driver chip on the first panel layer, wherein the glass cover plate covers the screen module, and
    wherein the glass cover plate is located on a side of the first panel layer away from the display driver chip.

10. The screen module according to claim 9, wherein the support layer comprises a first support plate and a second support plate, wherein the first support plate and the second support plate are stacked, and wherein the second support plate is located on a side close to the bent region.

11. The screen module according to claim 10, wherein the second support plate is located on a side of the first support plate away from the first panel layer.

12. The screen module according to claim 10, wherein a bending radius of the bent region is less than 0.3 mm.

13. The screen module according to claim 9, wherein the support layer comprises a first support plate and a second support plate, wherein the first support plate and the second support plate are disposed side by side, wherein a thickness of the second support plate is greater than a thickness of the first support plate, wherein the second support plate is disposed close to the bent region, and wherein a length of the second support plate is less than a distance between the display driver chip and the bent region.

14. The screen module according to claim 9, wherein the support layer comprises a first support plate, and wherein the first support plate is a support plate with a non-uniform thickness.

15. The screen module according to claim 9, wherein a bending radius of the bent region is less than 0.3 mm.

16. The screen module according to claim 9, wherein a bending radius of the bent region is 0.2 mm to 0.3 mm.

17. The display assembly according to claim 9, wherein the screen module further comprises a polarizer layer, wherein the polarizer layer is located on a side of the first panel layer away from the display driver chip.

18. The display assembly according to claim 17, wherein the polarizer layer of the screen module is adhesively connected to the glass cover plate through an optical clear adhesive layer.

19. An electronic device, comprising:
 a battery cover; and
 a display assembly, comprising:
  a glass cover plate; and
  a screen module, comprising:
   a single display panel bent to form a first panel layer and a second panel layer, wherein the first panel layer is spaced apart from the second panel layer, and wherein the first panel layer and the second panel layer are connected by a bent region;
   a support layer located between the first panel layer and the second panel layer, wherein a thickness of the support layer close to the bent region is greater than a thickness of a first region of the support layer; and
   a display driver chip located on a side of the second panel layer away from the first panel layer, wherein a projection of the first region of the support layer on the first panel layer overlaps with a projection of the display driver chip on the first panel layer,
  wherein the glass cover plate covers the screen module,
  wherein the glass cover plate is located on a side of the first panel layer away from the display driver chip, and
  wherein the battery cover is located on a side of the screen module away from the glass cover plate.

20. The screen module according to claim 19, wherein the support layer comprises a first support plate and a second support plate, wherein the first support plate and the second support plate are stacked, and wherein the second support plate is located on a side close to the bent region.

* * * * *